United States Patent
Horng et al.

(10) Patent No.: US 7,211,447 B2
(45) Date of Patent: May 1, 2007

(54) STRUCTURE AND METHOD TO FABRICATE HIGH PERFORMANCE MTJ DEVICES FOR MRAM APPLICATIONS

(75) Inventors: Cheng T. Horng, San Jose, CA (US); Ru-Ying Tong, Los Gatos, CA (US); Mao-Min Chen, San Jose, CA (US); Liubo Hong, San Jose, CA (US); Min Li, Dublin, CA (US)

(73) Assignees: Headway Technologies, Inc., Milpitas, CA (US); Applied Spintronics, Inc., Milpitas, CA (US)

( * ) Notice: Subject to any disclaimer, the term of this patent is extended or adjusted under 35 U.S.C. 154(b) by 100 days.

(21) Appl. No.: 11/080,868

(22) Filed: Mar. 15, 2005

(65) Prior Publication Data

US 2006/0211198 A1 Sep. 21, 2006

(51) Int. Cl.
*H01L 21/00* (2006.01)
(52) U.S. Cl. ............ 438/3; 365/158; 365/185.19
(58) Field of Classification Search ............ 438/3; 257/E21.665
See application file for complete search history.

(56) References Cited

U.S. PATENT DOCUMENTS

| | | | |
|---|---|---|---|
| 6,703,654 B1 | 3/2004 | Horng et al. | 257/295 |
| 6,743,641 B2 | 6/2004 | Yates et al. | 438/3 |
| 6,831,312 B2 | 12/2004 | Slaughter et al. | 257/295 |
| 2005/0020011 A1* | 1/2005 | Nakajima et al. | 438/257 |
| 2005/0226052 A1* | 10/2005 | Horng et al. | 365/185.19 |
| 2005/0260772 A1* | 11/2005 | Horng et al. | 438/3 |
| 2005/0276099 A1* | 12/2005 | Horng et al. | 365/158 |

OTHER PUBLICATIONS

Co-pending U.S. Appl. No. 10/844,171, filed May 12, 2004, assigned to the same assignee.
Co-pending U.S. Appl. No. 10/849,310, filed May 19, 2004, assigned to the same assignee.
Co-pending U.S. Appl. No. 10/868,715, filed Jun. 15, 2004, assigned to the same assignee.
Co-pending U.S. Appl. No. 11/080,860, filed Mar. 15, 2005, assigned to the same assignee.
Co-pending U.S. Appl. No. 11/080,867, filed Mar. 15, 2005, assigned to the same assignee.

(Continued)

*Primary Examiner*—Thao P. Le
(74) *Attorney, Agent, or Firm*—Sqile Ackerman LLC; Stephen B. Ackerman (57) ABSTRACT

A method of forming a high performance MTJ in an MRAM array is disclosed. A Ta/Ru capping layer in a bottom conductor is sputter etched to remove the Ru layer and form an amorphous Ta capping layer. A key feature is a subsequent surface treatment of the Ta capping layer in a transient vacuum chamber where a self-annealing occurs and a surfactant layer is formed on the Ta surface. The resulting smooth and flat Ta surface promotes a smooth and flat surface in the MTJ layers which are subsequently formed on the surfactant layer. For a 0.3×0.6 micron MTJ bit size, a 35 to 40 Angstrom thick NiFe(18%) free layer, an AlOx barrier layer generated from a ROX oxidation of an 9 to 10 Angstrom thick Al layer, and a Ru/Ta/Ru capping layer are employed to give a dR/R of >40% and an RA of about 4000 ohm-$\mu m^2$.

20 Claims, 6 Drawing Sheets

OTHER PUBLICATIONS

"Exchange-biased magnetic tunnel junctions and application to nonvolatile magnetic random access memory (invited)," by S.S.P. Parkin et al., Jrnl. of Appl. Phys., vol. 85, No. 8, Apr. 15, 1999, pp. 5828-5833.

Abstracts, Session BD, Tues. afternoon, Jan. 6, 2004, Marquis NW, *Magnetic Tunnel Junctions*-1, Paulo Freitas, Chair, p. 87.

"Progress and Outlook for MRAM Technology," by S. Tehrani et al., IEEE Trans. on Magnetics, vol. 35, No. 5, Sep. 1999, pp. 2814-2819.

"Magneto resistive Random Access Memory Using Magnetic Tunnel Junctions," by Saied Tehrani et al., Proc. of IEEE, vol. 91, No. 5, May 2003, pp. 703-712.

"Magnetic Tunnel Junction Materials for Electronic Applications" J.M. Slaughter, et al., 1 of 3 papers of Jun. 2000 *JOM-e* elec. suppl. of *JOM* pp. 1-10 retrieved from Internet Jun. 17, 2004, http://www.tms.org/pubs/journals/JOM/0006/Slaughter/Slaughter-0005/html.

"Fabrication of high-magneto resistance tunnel junctions using CO75Fe25 ferromagnetic electrodes," by Xiu-Feng Han et. al., Appl. Phys. Letters, vol. 77, No. 2, Jul. 10, 2000, pp. 283-285.

"High-Performance MRAM Technology with an Improved Magnetic Tunnel Junction Material", by M. Motoyoshi et al., 2002 Symp. On VLSI Tech. Digest of Tech. Papers, IEEE Jrnl. of Solid-State Circuits, pp. 212-213.

"Oxygen as a surfactant in the growth of giant magneto-resistance spin valves," by W.F. Egelhoff,Jr., Jrnl. of Applied Physics, vol. 82, No. 12, Dec. 15, 1997, pp. 6142-6151.

* cited by examiner

STRUCTURE AND METHOD TO FABRICATE HIGH PERFORMANCE MTJ DEVICES FOR MRAM APPLICATIONS

RELATED PATENT APPLICATIONS

This application is related to U.S. patent application Ser. No. 11/080,860 and filed Mar. 15, 2005, owned by a common assignee as the instant invention.

This application is related to the following: Ser. No. 10/844,171, filing date May 12, 2004; Ser. No. 10/849,310, filing date May 19, 2004; Ser. No. 10/868,715, filing date Jun. 15, 2004; Ser. No 11/080,867, filing date Mar. 15, 2005: Ser. No. 11/080,860, filing date Mar. 15, 2005.

FIELD OF THE INVENTION

The invention relates to a high performance Magnetic Tunneling Junction (MTJ) element and a method for making the same, and in particular, to a method of treating the bottom conductor line in an MRAM array so that the overlying MTJ elements have a greater magnetoresistive effect while achieving the desired RA range.

BACKGROUND OF THE INVENTION

Magnetoresistive Random Access Memory (MRAM), based on the integration of silicon CMOS with MTJ technology, is a major emerging technology that is highly competitive with existing semiconductor memories such as SRAM, DRAM, Flash, etc. An MRAM device is generally comprised of an array of parallel first conductive lines on a horizontal plane, an array of parallel second conductive lines on a second horizontal plane spaced above and formed in a direction perpendicular to the first conductive lines, and an MTJ element interposed between a first conductive line and a second conductive line at each crossover location. This so called "cross-point" MRAM structure is designed for high density but low speed. A first conductive line may be a digit line while a second conductive line is a bit line or vice versa. Alternatively, a first conductive line may be a bottom electrode that is a sectioned line while a second conductive line is a bit line (or digit line). Optionally, there is a high performance MRAM architecture that is based on a 1T1MTJ cell for high speed. There are typically other devices including transistors and diodes below the array of first conductive lines as well as peripheral circuits used to select certain MRAM cells within the MRAM array for read or write operations.

Figure 1:
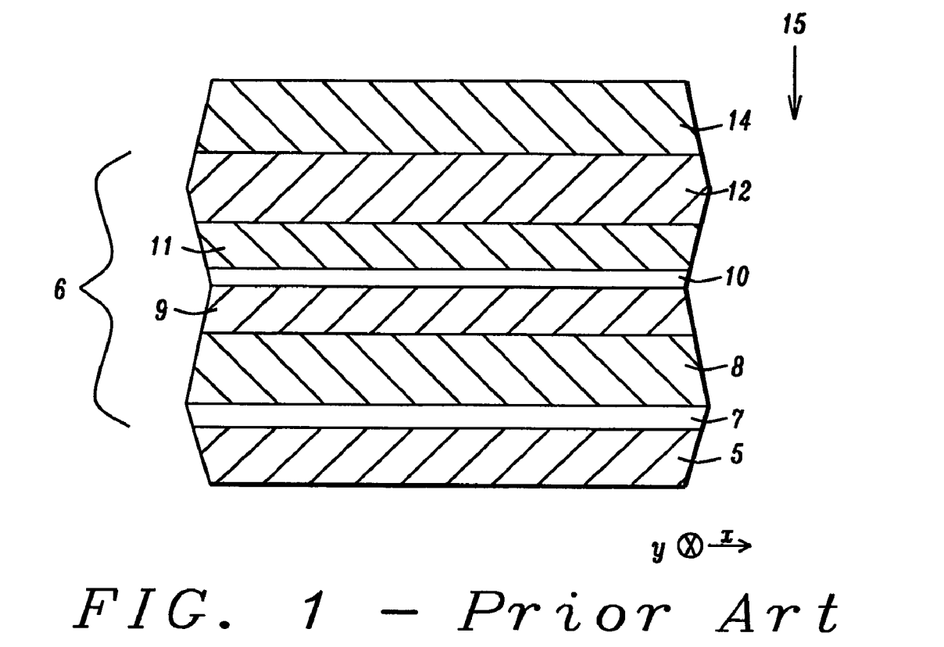
FIG. 1 is a cross-sectional view showing a conventional MTJ element which is formed between a bottom electrode and a top electrode in an MRAM structure.

In FIG. 1, an MTJ element 6 is shown that is based on a tunneling magneto-resistance (TMR) effect wherein a stack of layers has a configuration in which two ferromagnetic layers are separated by a thin non-magnetic dielectric layer. In an MRAM device, the MTJ element is formed between a bottom electrode 5 such as a first conductive line and a top electrode 14 which is a second conductive line. The bottom electrode 5 also known as a bottom conductor typically has a seed layer/conductive layer/capping layer configuration and is used to connect the MTJ element 6 to the transistor (not shown). The bottom (seed) layer 7 in the MTJ element 6 is generally comprised of one or more seed layers that promote a smooth and dense crystal growth in overlying MTJ layers. Above the seed layer 7 is an antiferromagnetic (AFM) pinning layer 8 and a first ferromagnetic layer that is a "pinned" layer 9 on the AFM layer. The thin tunnel barrier layer 10 above the pinned layer 9 is generally comprised of a dielectric material such as AlOx that is formed by first depositing an Al layer and then performing an in-situ oxidation. The tunnel barrier layer 10 must be extremely uniform over the wafer since small AlOx thickness variations result in large variations in resistance. It follows that to achieve a uniform tunnel barrier, the bottom conductor 5 upon which the tunnel barrier layer 10 is formed must be very smooth and flat. A ferromagnetic "free" layer 11 is formed on the tunnel barrier layer 10 and is preferably less than 50 Angstroms thick to obtain low switching fields in the patterned bits. At the top of the MTJ stack is a capping layer 12.

The MTJ stack in FIG. 1 has a so-called bottom spin valve configuration. Alternatively, an MTJ stack may have a top spin valve configuration in which a free layer is formed on a seed layer followed by sequentially forming a tunnel barrier layer, a pinned layer, AFM layer, and a capping layer.

The pinned layer 9 has a magnetic moment that is fixed in the y direction by exchange coupling with the adjacent AFM layer 8 that is also magnetized in the y direction. The free layer 11 has a magnetic moment that is either parallel or anti-parallel to the magnetic moment in the pinned layer. The tunnel barrier layer 10 is so thin that a current through it can be established by quantum mechanical tunneling of conduction electrons. The magnetic moment of the free layer may switch in response to external magnetic fields and it is the relative orientation of the magnetic moments between the free and pinned layers that determines the tunneling current and therefore the resistance of the tunneling junction. When a sense current 15 is passed from the top electrode 14 to the bottom electrode 5 in a direction perpendicular to the MTJ layers, a lower resistance is detected when the magnetization directions of the free and pinned layers are in a parallel state ("1" memory state) and a higher resistance is noted when they are in an anti-parallel state or "0" memory state.

Figure 2:
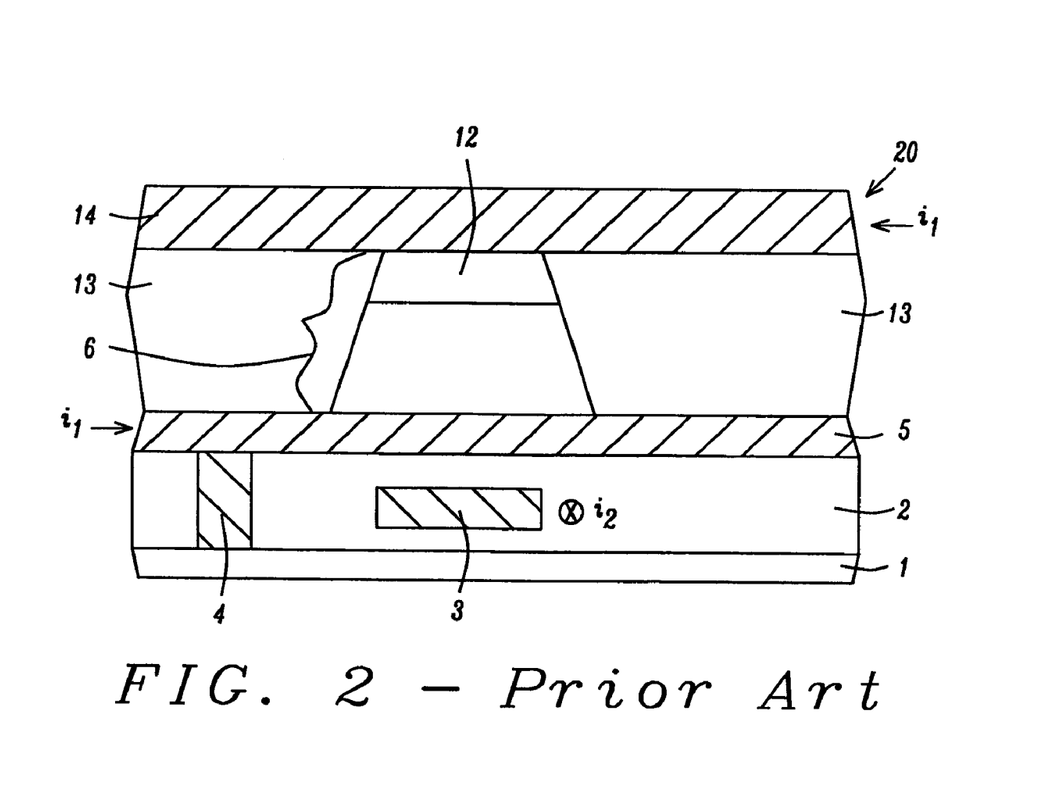
FIG. 2 is a cross-sectional view of a prior art 1T1MTJ MRAM structure in which an MTJ is formed between a bottom conductor and an overlying bit line while a word line is located in an insulation layer below the bottom conductor.

Referring to FIG. 2, the MTJ element 6 is shown interposed between the bottom conductor 5 and the top conductor 14 in an MRAM cell 20. The substrate 1 is comprised of a transistor (not shown) that is typically connected to the bottom conductor by a stud 4. A digit line 3 (word line in a 1T1MTJ) is formed below the MTJ element 6 and within a first insulation layer 2 that is usually a composite layer consisting of a stack of two or more dielectric layers on the substrate which are not shown in order to simplify the drawing. The MTJ element 6 contacts the top conductor 14 (bit line) through the capping layer 12 and is formed in a second insulation layer 13 that is disposed on the bottom conductor 5. From a top-down perspective (not shown), a plurality of MTJ elements is formed in an array between multiple rows of bottom conductors (word lines) and multiple columns of top conductors (bit lines). Each MRAM has its own bottom conductor line.

Switching of the free layer magnetization in the MTJ bit is accomplished by applying currents in orthogonal directions. For instance, the MTJ element may be elliptical in shape with a long axis running parallel to the underlying digit or word line 3. Currents $i_1$ running transversely in the bit line 14 and bottom conductor 5 are orthogonal to the current $i_2$ in the digit line (MTJ) or word line 3 (1T1MTJ). Thus, the current $i_1$ provides the field parallel to the easy axis of the bit while the current $i_2$ provides the perpendicular (hard axis) component of the field. The intersection of the conductive lines generates a peak field that is engineered to be just over the switching threshold of the MTJ.

In a read operation, the information stored in an MRAM cell is read by sensing the magnetic state (resistance level) of the MTJ element through a sense current flowing top to bottom through the cell in a current perpendicular to plane (CPP) configuration. During a write operation, information is written to the MRAM cell by changing the magnetic state in the free layer to an appropriate one by generating external magnetic fields as a result of applying bit line and word line currents in two crossing conductive lines, either above or below the MTJ element. In cross-point MRAM architecture, the top electrode or the bottom electrode participates in both read and write operations.

A high performance MTJ element is characterized by a high magnetoresistive (MR) ratio which is dR/R where R is the minimum resistance of the MTJ element and dR is the change in resistance observed by changing the magnetic state of the free layer. A higher dR/R improves the readout speed in an MRAM array. In order to achieve good tunnel barrier properties such as a specific junction resistance x area (RA) value and a high breakdown voltage (Vb), it is necessary to have a uniform tunnel barrier layer that is promoted by a smooth and flat bottom conductor. Present MRAM array technology is designed for a 0.3×0.6 micron MTJ bit size with an RA in the range of 3000 to 4000 ohm-$\mu m^2$ and with a dR/R>35%.

Although a free layer made of a high spin polarization material such as NiFeCo, CoFe(25%), or CoFeB provides a high dR/R, the result is unfavorable magnetic properties such as high values for switching field ($H_C$), $H_K$, and magnetostriction ($\lambda_S$). On the other hand, moderate spin polarization materials such as NiFe(<20%) minimize $\lambda_S$ and reduce $H_C$ and switching field distribution ($\sigma H_C$), but dR/R is normally below 30%. Therefore, for present generation devices (0.3×0.6 micron bits), an MTJ is needed wherein $H_C$, $H_K$, $\lambda_S$ are acceptably low, dR/R is greater than 35%, and RA is in a desirable range of about 3000 to 4000 ohm-$\mu m^2$. Moreover, for future generations (0.2×0.4 micron bits), an MTJ having RA<1000 ohm-$\mu m^2$ and dR/R>40% is needed. To our knowledge, these objectives have not yet been reached.

In U.S. Pat. No. 6,703,654, a smooth bottom conductor comprised of a high melting point metal is formed on a NiCr seed layer to improve performance in an overlying MTJ film.

The performance of an MTJ element is enhanced according to U.S. Pat. No. 6,831,312 by incorporating an amorphous alloy such as CoFeB as the pinned layer and free layer in an MTJ stack. Boron is included in the alloy to control the recrystallization temperature and polarization of the resulting MTJ device.

In U.S. Pat. No. 6,743,641, surface planarity on a first conductor layer is improved prior to bit material deposition in an MRAM structure by depositing a second conductor layer comprised of Ta on the polished surface of the first conductor. The second conductor is lightly polished to remove a top portion thereof and thereby conformally cover rough portions of the first conductor.

SUMMARY OF THE INVENTION

One objective of the present invention is to provide a method of treating a bottom conductor in an MRAM cell so that a subsequently deposited MTJ element has a dR/R of at least 35% and achieves a desired RA range for a certain MTJ bit size.

A second objective of the present invention is to provide a method of forming an MTJ device according to the first objective that also incorporates a moderate spin polarization free layer in the MTJ element in order to minimize $\lambda_S$ $H_C$ and $\sigma H_C$.

A third objective of the present invention is to provide an MRAM structure in which a MTJ element has a dR/R greater than 35%, an acceptable RA for a certain bit size, and minimum values for $\lambda_S$, $H_C$ and $\sigma H_C$.

According to a first embodiment, these objectives are achieved by providing a substrate on which an MRAM structure is to be formed. The substrate typically is comprised of an isolation transistor and a stud connected thereto which are formed in one or more insulation layers. A patterned bottom conductor layer with a seed layer/conductor/capping layer configuration is formed on the surface of the substrate and is in electrical contact with the stud and isolation transistor. In MRAM architecture, the bottom conductor is used to connect the isolation transistor to a subsequently formed MTJ. In one aspect, the bottom conductor has a Ta/Cu/Ta/Ru configuration in which the Ru layer is subsequently removed by a sputter etch process that forms an amorphous-like disordered Ta capping layer before the MTJ stack is deposited. The sputter etch process helps to form a smooth Ta capping layer that promotes smooth and flat layers within the subsequently formed MTJ element.

The sputter etch process first involves loading a plurality of substrates in a load-lock chamber of a sputter deposition tool such as an Anelva C-7100 sputtering system and reducing the pressure therein to lower than $5\times10^{-7}$ torr. In the exemplary embodiment, a first substrate with a patterned bottom conductor layer is then transferred to a sputter etch chamber where it is subjected at a pressure of about $5\times10^{-8}$ to $5\times10^{-9}$ torr to a sputter etching or ion milling method to remove the Ru layer and an upper portion of the underlying Ta layer. In addition, the sputter etching removes a TaO layer that typically grows on the Ta layer during formation of the bottom conductor.

The first substrate is transferred to a transient chamber which may be the load-lock chamber wherein the pressure is about an order of magnitude higher than the sputter etch chamber and thereby the capping layer in the bottom conductor undergoes a self-annealing. Meanwhile, a surfactant layer less than one atomic layer thick in its equilibrium state forms on the capping layer and is comprised of oxygen, nitrogen, and OH groups which are the major constituents of residual gases in the transient chamber. Optionally, the transient chamber may be an oxidation chamber in which case the surfactant layer is comprised primarily of oxygen. In turn, each of the plurality of substrates are transferred to the sputter etch chamber and bottom conductor layers thereon are etched. After all substrates are etched and moved to the transient chamber for self-annealing and surfactant layer growth, the substrates are transferred to a sputter deposition chamber where a conventional sputter deposition process is followed to form the MTJ stack of layers.

In one embodiment, the MTJ stack has a bottom spin valve configuration in which a seed layer, AFM layer, synthetic anti-parallel (SyAP) pinned layer, an AlOx tunnel barrier layer, a moderate spin polarization free layer such as NiFe(18%), and a cap layer are sequentially formed. Oxidation of the Al layer is accomplished by a radical oxidation (ROX) method prior to depositing the free layer and cap layer.

The plurality of substrates having an MTJ stack deposited on the sputter etched bottom conductor is returned to the load-lock chamber and then removed from the sputter deposition tool. Wafers having an MTJ stack formed thereon are further annealed to fix the pinned layer direction. Thereafter, a conventional photoresist patterning and etching sequence is followed to define the sidewalls and top surface of the MTJ element. An insulation layer is disposed adjacent to the MTJ sidewalls and is planarized to be about coplanar with the top surface of the MTJ element. Finally, a top conductor electrode (bit line) is formed on the top surface of the MTJ.

In a second embodiment, an alternative method is used to fabricate the MTJ and MRAM array. The substrates are loaded in a load-lock chamber of a sputter deposition tool and then transferred to a first sputter deposition chamber where the bottom conductor is deposited. In one aspect, the bottom conductor has a Ta/Cu/Ta/Ru configuration as described previously. The substrates with a bottom conductor layer are returned to the load-lock chamber. The sequence described in the first embodiment that includes sputter etching followed by substrate transfer to a transient vacuum chamber where self-annealing and surfactant layer formation occurs is performed. Next, the substrates are moved to a second sputter deposition chamber which preferably is a different chamber than the first sputter deposition chamber to achieve higher throughput. Each substrate is subjected to a process that involves deposition of an MTJ stack on the surfactant layer above the sputter etched bottom conductor layer and then transfer to the load-lock chamber for subsequent unloading. All of the steps in the sputter deposition tool may be performed after a single pump down step.

An MTJ element is defined by forming a first photoresist pattern on the MTJ stack and etching with an ion beam etch (IBE) or the like to remove exposed portions of the MTJ stack before stopping on the bottom conductor layer. The first photoresist pattern is stripped and then a second photoresist pattern is formed on each substrate. Exposed portions of the bottom conductor layer are etched to generate a patterned bottom conductor. The second photoresist pattern is removed and a conventional process of forming an insulation layer adjacent to the sidewalls of the MTJ followed by forming a top conductor that contacts the top surface of the MTJ is carried out.

The present invention also encompasses an MRAM structure having an MTJ element interposed between a bottom conductor and a top conductor in a cross-point array. A key feature is that the bottom conductor has a seed layer/conductor/capping layer configuration wherein the capping layer has a smooth, flat, and very thin (less than 1 atomic layer thick) surfactant layer comprised of oxygen, hydroxyl (—OH) groups, and nitrogen formed thereon. Optionally, an oxygen surfactant layer is formed. The surfactant layer is responsible for smooth and flat layers in the overlying MTJ element and thereby imparts improved performance with respect to dR/R and RA. In one embodiment, the MTJ element has a bottom spin valve configuration in which a seed layer, AFM layer, synthetic anti-parallel (SyAP) pinned layer, an AlOx tunnel barrier layer, a moderate spin polarization free layer such as NiFe(18%), and a cap layer are sequentially formed. The moderate spin polarization free layer enables a high dR/R and the desired RA to be achieved while minimizing $\lambda_S$, $H_C$, and $\sigma H_C$.

Alternatively, the MTJ element may be formed in a TMR read head wherein an amorphous Ta capping layer is disposed on a bottom shield. A surfactant layer is formed on the amorphous capping layer and an MTJ element is fabricated on the amorphous capping layer. There is a top shield formed on the MTJ element.

DETAILED DESCRIPTION OF THE INVENTION

The present invention is a method of fabricatng a high performance MTJ that involves a surface treatment of a sputter etched bottom conductor. Although an MRAM application is described herein, the present invention may be employed in other technologies based on an MTJ device such as TMR read heads. Moreover, the present invention is not limited to the type of MRAM architecture, and may apply to cross-point, 1T1MTJ, or other designs used in the art. The drawings are provided by way of example and are not intended to limit the scope of the invention. The drawings are not necessarily drawn to scale and the relative sizes of various elements may vary compared with those in an actual device.

Figure 3:
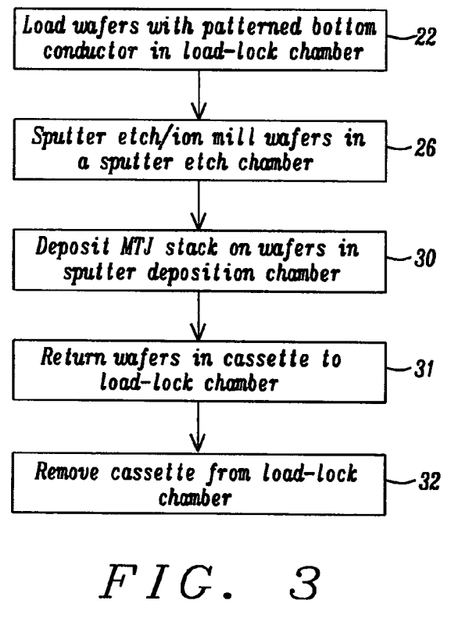
FIGS. 3–4 are flow diagrams showing methods previously practiced by the inventors for sputter etching a bottom conductor prior to depositing an MTJ stack of layers thereon.
Figure 5:
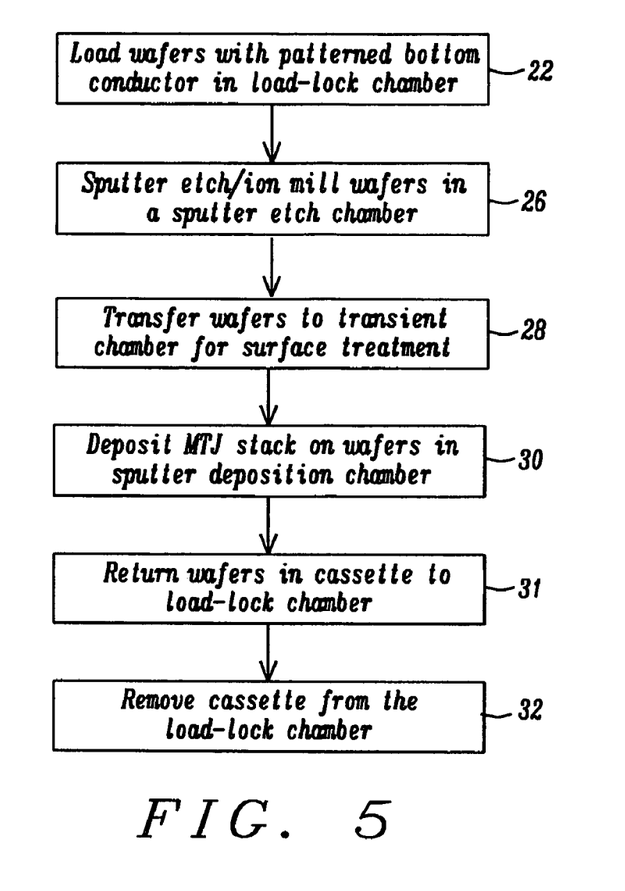
FIG. 5 is a flow diagram that depicts one embodiment of the present invention in which a bottom conductor in an MRAM array is subjected to a surface treatment after a sputter etching step and before deposition of the MTJ stack.

Referring to FIG. 3, a flow diagram is shown that represents a method of forming an MTJ in an MRAM structure that was previously practiced by the inventors. The inventors have surprisingly found that by inserting an additional step (step 28) as shown in FIG. 5 which is a flow diagram that represents an embodiment of the present invention, a higher performance MTJ with improved dR/R may be realized without compromising any MTJ properties. Note that the terms "wafer" and "substrate" may be used interchangeably hereafter.

Step 22 involves loading a plurality of wafers having a patterned bottom conductor formed thereon in a load-lock chamber of a sputter deposition tool such as an Anelva C-7100 sputter deposition system which includes ultra high vacuum DC magnetron sputter chambers and oxidation chambers. Typically, the sputter deposition process involves an argon sputter gas and each sputter chamber has multiple targets which are low pressure discharge cathodes. Once the wafers are loaded, the load-lock chamber is pumped down to a pressure of less than $5 \times 10^{-7}$ torr. Sputter chambers in the Anelva C-7100 system typically operate at a base pressure between $5 \times 10^{-8}$ and $5 \times 10^{-9}$ torr.

Figure 6:
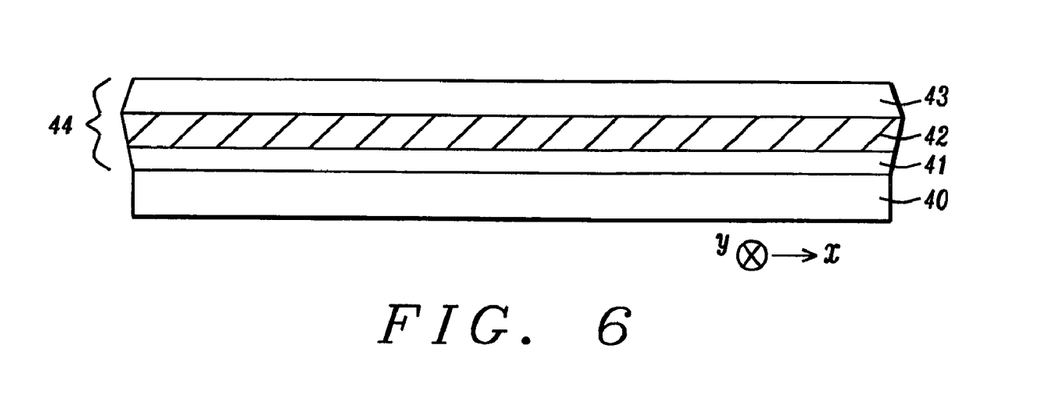
FIG. 6 is a cross-sectional view showing the step of forming a bottom conductor in an MRAM structure according to a first embodiment of the present invention.

Referring to FIG. 6, a substrate 40 is provided that typically comprises an isolation transistor (not shown) and an attached stud (not shown) that has a top surface which is coplanar with the top surface of the substrate. The stud is used to connect the isolation transistor to the bottom conductor 44. The bottom conductor 44 may have a seed layer/conductor/capping layer configuration. In one embodiment, the seed layer 41 is made of NiCr having a thickness of about 45 Angstroms and the conductor 42 is comprised of a Ru film about 100 Angstroms thick. Alternatively, the seed layer 41 may be comprised of Ta and the conductor 42 is made of Cu, Al, Au, or other conductive materials used in the art. As noted in U.S. Pat. No. 6,703,654 assigned to Headway Technologies, Inc., and which is herein incorporated by reference, other high melting point metals such as Ir and Rh that have a small grain size and a smooth surface may be advantageously used as the conductor 42. The capping layer 43 may be one or more of Ta, Ru, Ti, Cr, or composites thereof such as a composite with an upper Ru layer and a lower Ta layer. The layers 41–43 are sequentially deposited by an ion beam deposition (IBD) method or the like in a sputter deposition system (tool). Conventional methods are used to pattern the bottom conductor 44.

Returning to FIG. 5, the wafers are held in a cassette that is moved from one chamber to another within the sputter deposition tool during a sequence of steps. Those skilled in the art will appreciate that a bottom conductor is disposed on a substrate below every location where an MTJ element will subsequently be formed. The bottom conductor pattern (not shown) is typically comprised of plurality of line segments having a length and width wherein the lengthwise direction is parallel to a first axis (x-axis in FIG. 6). Note that each MRAM device has its own bottom conductor 44. When the subsequently formed MTJ element is elliptical in shape, the widthwise direction of the bottom conductor is parallel to the lengthwise direction of the word line (not shown) and to the long axis (easy axis) of the MTJ element which in FIG. 6 is the y-axis. For the purpose of this discussion, the bottom conductor 44 is a thin conductor line that is used to conduct current in a +x or −x direction.

It is understood that the MRAM structure is part of an MRAM array in which multiple parallel word lines are formed in a first conductive layer and multiple top conductor electrodes such as parallel bit lines are formed in a second conductive layer above an array of MTJs. In the exemplary embodiment, terminology relating to a 1T1MTJ will be used although the method and resulting MRAM structure of the present invention could also apply to cross-point MRAM architecture.

Figure 7:
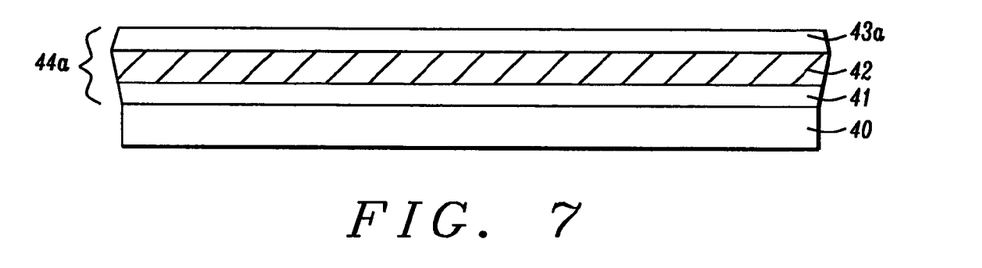
FIG. 7 is a cross-sectional view after a portion of the capping layer in the bottom conductor in FIG. 6 is sputter etched according to one embodiment of the present invention.

In step 26, a wafer is transported to a sputter etch chamber where a sputter etch or ion milling process is performed to remove an upper portion of the capping layer 43 (bottom conductor). As described in Headway patent application HT03-022 which is herein incorporated by reference, a Ta/Ru capping layer on a bottom conductor is sputter etched to remove the Ru layer and a portion of the underlying Ta layer and thereby generate an amorphous Ta capping layer. This process removes any oxide on the surface of the capping layer 43 and forms an amorphous surface on the remaining capping layer 43a (FIG. 7) that promotes smooth and flat layers within the MTJ stack formed in a subsequent step. In the exemplary embodiment, the Ru layer is entirely removed along with approximately 20 to 30 Angstroms of the underlying Ta layer that may initially be about 80 to 150 Angstroms thick.

Returning to FIG. 3, step 26 is completed and then the etched wafer is moved directly to a sputter deposition chamber where in step 30 the desired MTJ stack is deposited by magnetron sputtering or an IBD method on the sputter etched bottom conductor. Similarly, other wafers in the cassette are processed in step 26 and then moved directly to step 30 where the MTJ stack is deposited.

It should be noted that forming an AlOx tunnel barrier in step 30 may comprise transferring the wafer (after Al deposition on the pinned layer) to an oxidation chamber where a radical oxidation (ROX) process is performed and then returning to the sputter deposition chamber to deposit the free layer and capping layer on the AlOx layer. The ROX process used for the present invention was previously described in Headway application HT03-022 and involves placing a grid-like shower cap between an upper ionizing electrode and a substrate surface (Al layer) in an oxidation chamber. A radical shower is generated in the upper electrode above the shower cap with an RF power of between 300 and 1000 watts and with a 300 to 500 standard cubic centimeters per minute (sccm) oxygen flow rate for a period of about 100 to 200 seconds. Those skilled in the art will appreciate that oxidation may also be accomplished by using plasma oxidation or by applying a natural oxidation technique in the sputter deposition system.

Once a wafer finishes step 30, it is returned to a cassette in the load-lock chamber (step 31). When all the wafers finish step 30 and are collected in the cassette, the cassette may be removed (step 32) from the load-lock chamber and additional processing such as annealing and patterning the MTJ stack to form an MTJ element is performed. Unfortunately, the MTJ performance resulting from the process flow in FIG. 3 does not meet the requirements for current and advanced product designs mainly due to a low dR/R value.

Table 1 shows that an MTJ with a bottom spin valve configuration represented by NiCr45/MnPt150/CoFe23/Ru/CoFe20/AlOx/NiFe40/Ru30/Ta30/Ru100 and formed on a bottom conductor 44a (NiCr50/Ru100/Ta150) processed according to step 26 has a dR/R below 30% and a Hin (interlayer coupling field) value that is unacceptably high. The Hin value is related to film roughness and should be as small as possible. The seed layer, AFM layer, SyAP pinned layer, tunnel barrier, free layer, and capping layer are NiCr, MnPt, (CoFe/Ru/CoFe), AlOx, NiFe(18%), and (Ru/Ta/Ru), respectively. The inventors have previously practiced a process in which a NiCr seed layer for an MTJ stack is deposited on an amorphous Ta layer as described in Headway patent application HT03-025/031 which is herein incorporated by reference.

With respect to the results in Table 1, the sputter etch (S/E) also known as step 26 was performed using a RF power of 200 watts and a 30 sccm Ar gas flow. The AlOx layer was formed by depositing a 10 Angstrom thick Al layer on the pinned layer in the sputter desposition chamber and then oxidizing for various cycle times with an ROX technique in an oxidation chamber using a radical shower produced with an 800 watt RF power in the upper electrode and a 500 sccm $O_2$ flow rate. Following step 32, the as-deposited MTJ wafers were annealed in a vacuum oven at 280° C. with a 10000 Oe applied magnetic field for 5 hours to set the pinned layer magnetization direction. RA values and MR% were measured with a commercially available Capres system.

TABLE 1

MTJ results for MTJ fabricated by conventional method (FIG. 3)

| Sputter etch time (sec.) | ROX time (sec.) | RA ohm-μm² | MR % (dR/R) | Hc (Oe) | Hin (Oe) |
|---|---|---|---|---|---|
| 100 | 150 | 354.2 | 25.08 | 1.71 | 10.64 |
| 100 | 175 | 449.7 | 24.10 | 1.91 | 11.20 |
| 100 | 200 | 617.9 | 22.31 | 2.27 | 10.96 |
| 100 | 225 | 792.7 | 22.31 | 2.27 | 11.12 |

Figure 4:
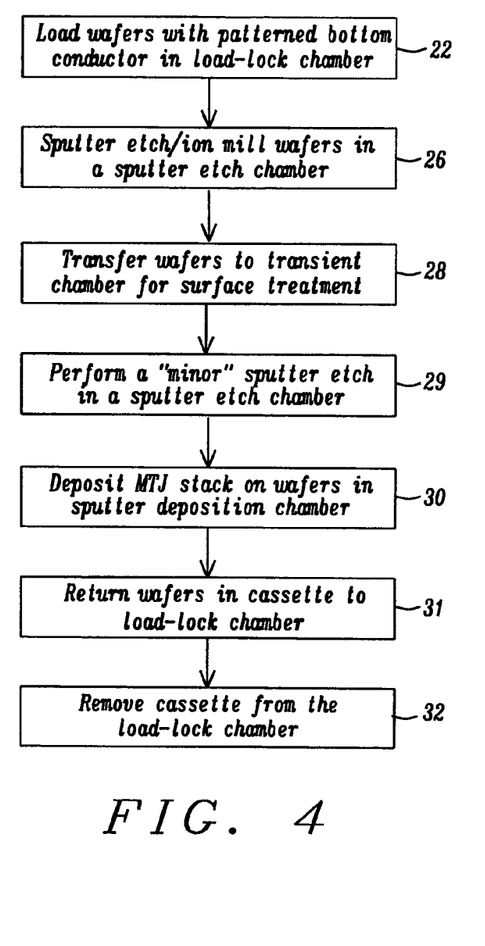

The invention discovered that by transferring the sputter etched wafers from step 26 to a transient vacuum chamber (step 28) for a certain period of time and by inserting a minor sputter etch (step 29) prior to MTJ stack deposition as depicted in FIG. 4, the MR ratio and value increased compared with the values obtained from the standard process flow in FIG. 3. It was initially believed that step 29 was required to prevent an over-oxidation of the Ta capping layer 43. A surface treatment (step 28) occurs when a wafer is moved to a transient vacuum chamber that is maintained at an ambient temperature (RT) and preferably at a pressure about 1 order of magnitude greater than the sputter etch chamber. For example, the transient vacuum chamber may be the load-lock chamber that normally has a base pressure between $5 \times 10^{-7}$ and $5 \times 10^{-8}$ torr. the residence time for each wafer in the transient vacuum chamber may vary from about 1 minute to greater than 1 hour and during this time a "self-annealing" occurs that relieves the strain built up in the bottom conductor 44 from the preceding sputter etch step. It is believed that in a standard process (FIG. 3) the self-annealing time between step 26 and step 30 is too short and the vacuum is too high to form a surfactant layer.

Figure 8:
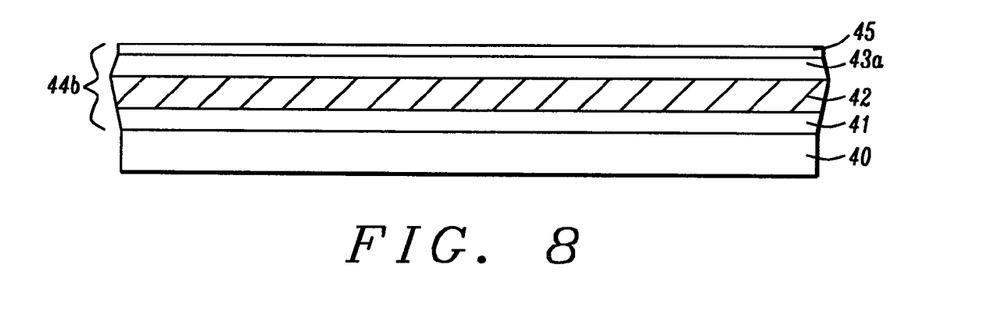
FIG. 8 is a cross-sectional view after the substrate in FIG. 7 is transferred to a transient vacuum chamber and a surfactant layer is formed on the capping layer.

In addition to the self-annealing process in step 28, a surfactant layer 45 (FIG. 8) comprised of oxygen, nitrogen, and hydroxyl (OH) groups (which are the major constituents of the residual gases in the transient vacuum chamber) forms with an equilibrium thickness of less than 1 atomic layer on the capping layer 43a. Alternatively, the transient vacuum chamber may be an oxidation chamber in which the surfactant layer 45 formed therein may be comprised primarily of oxygen. When an oxidation chamber is employed for step 28, the substrate 40 is kept in the transient vacuum chamber for at least 30 seconds. It should be understood that the residence time in the transient vacuum chamber may vary from wafer to wafer. Note that the minimum residence time is about 5 minutes when the transient vacuum chamber is a load-lock chamber.

Returning to FIG. 4, step 29 is referred to as a minor etch since the process time is about 10 to 20 seconds or less and is much shorter than step 26 which may be about 60 to 85 seconds in length. The minor etch is performed in a sputter etch chamber within the sputter deposition system prior to depositing the MTJ stack in step 30. Note that the sputter etch chamber employed for the minor sputter etch may be different than the sputter etch chamber used for step 26. Moreover, the surfactant layer formed in step 28 may be reduced somewhat in step 29. Thereafter, steps 30, 31, and 32 are followed to complete the flow sequence.

Wafers were processed through the flow sequence represented by FIG. 4 using the tack as described previously with respect to Table 1. However, the bottom conductor 44a was modified by the surface treatment (step 28) to give a bottom conductor 44b configuration represented by NiCr/Ru/Ta/SL where SL indicates a surfactant layer. An annealing as described previously was performed after step 32 and then the MTJ stack was analyzed by the Capres system. Results are presented in Table 2 and indicate that while MR values are above 35% for some samples, the RA values are still below the targeted range of 3000–4000 ohm-μm². Note that the interlayer coupling field (Hin) in Table 2 is smaller than in Table 1. Since Hin is measured on a full film MTJ stack, the results clearly show that the modified process flow (FIG. 4) produces a smoother and flatter bottom electrode which is the seed layer/AFM layer/pinned layer component in the MTJ stack. By reducing the minor etch time from 20 seconds (Sample 2) to 5 seconds (Sample 5), the MR is increased. This comparison indicates that a minor etch (step 29) is not necessary and that the insertion of step 28 is the main cause for improved performance in Table 2 relative to Table 1.

TABLE 2

MTJ results for MTJ fabricated by the modified process flow in FIG. 4

| Sample | S/E time (sec.) | ROX time (sec.) | RA ohm-μm² | MR % | Hc (Oe) | Hin (Oe) |
|---|---|---|---|---|---|---|
| 1 | 85/20 | 150 | 1105 | 31.78 | 2.13 | 4.13 |
| 2 | 85/20 | 175 | 1517 | 33.75 | 2.26 | 4.02 |
| 3 | 85/20 | 200 | 1919 | 35.19 | 2.34 | 4.02 |
| 4 | 85/20 | 225 | 2567 | 37.31 | 2.33 | 3.97 |
| 5 | 100/5 | 175 | 1484 | 35.00 | 1.90 | 4.01 |

The inventors demonstrated that by omitting the minor etch (step 29) and keeping the surface treatment (step 28) as shown in FIG. 5, a further improvement in device performance can be achieved. An additional adjustment was made to reduce the ROX cycle time as previously described with respect to step 30. In the preferred embodiment, the ROX process is accomplished by generating a radical shower with a 500 watt RF power and a 300 sccm $O_2$ flow rate for a period of 100 to 200 seconds. The remainder of the steps in the process sequence shown in FIG. 5 are performed as stated earlier.

Figure 9:
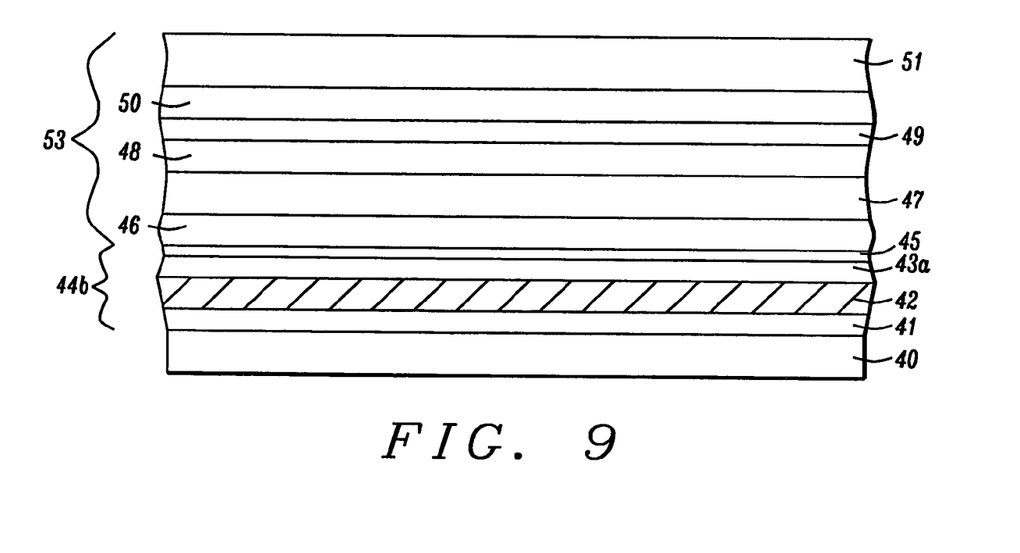
FIG. 9 depicts one embodiment of the present invention where an MTJ stack of layers is sputter deposited on the surfactant layer shown in FIG. 8.

Referring to FIG. 9, step 30 is now explained in more detail. A seed layer 46 that is preferably NiCr with a thickness between 40 and 60 Angstroms and with a Cr content between 35 and 45 atomic % is formed on the modified bottom conductor 44b that is comprised of an upper surfactant layer 45 which was formed in step 28. Optionally, the seed layer 46 may be made of NiFe or NiCrFe. An AFM layer 47 formed on the seed layer 46 is preferably made of MnPt with a thickness of about 100 to 200 Angstroms although an IrMn layer having a thickness from about 50 to 100 Angstroms is also acceptable. An external magnetic field may be applied during the deposition of an MTJ layer such as a pinned layer or free layer to influence a magnetization direction along a certain axis.

Above the AFM layer 47 is a pinned layer 48 that may have a synthetic anti-parallel (SyAP) configuration represented by AP2/Ru/AP1. The AP2 layer is formed on the AFM layer 47 and is preferably comprised of CoFe with a composition of about 10 atomic % Fe and with a thickness of about 20 to 30 Angstroms and more preferably 23

Angstroms. The magnetic moment of the AP2 layer is pinned in a direction anti-parallel to the magnetic moment of the AP1 layer. The slight difference in thickness between the AP2 and AP1 layers produces a small net magnetic moment for the SyAP pinned layer 48 along the easy axis direction of the MTJ element to be formed. Exchange coupling between the AP2 layer and the AP1 layer is facilitated by a coupling layer that is preferably comprised of Ru with a thickness of about 7.5 to 8.0 Angstroms although Rh or Ir may be used instead of Ru. In one embodiment, the AP1 layer on the Ru coupling layer is comprised of CoFe with a composition of about 25 to 50 atomic % Fe and a thickness of about 15 to 25 Angstroms and more preferably 20 Angstroms. Optionally, the AP1 layer may be a composite layer that includes a thin nano-oxide layer (NOL) such as FeTaO or CoFeO sandwiched between CoFe layers. A nano-oxide layer is employed to increase smoothness in the AP1 layer.

Above the SyAP pinned layer 48 is formed a thin tunnel barrier layer 49 which is preferably an oxidized Al layer that has an oxygen content which is close to an $Al_2O_3$ stoichiometry and is referred to as an AlOx layer. Initially, an Al layer having a thickness of about 9 to 10 Angstroms is deposited on the SyAP pinned layer 48 and is subsequently oxidized by an in-situ radical oxidation (ROX) as described previously. Alternatively, AlOx can be formed by a conventional plasma oxidation or natural oxidation method. The resulting AlOx layer has a thickness of about 12 to 15 Angstroms and preferably 14 Angstroms for an MTJ bit size of 0.3×0.6 microns. Those skilled in the art will appreciate that a thinner Al layer about 8 to 9 Angstroms in thickness is required to form a thinner AlOx layer (about 11 to 12 Angstroms thick) in order to reduce RA for a bit size of 0.2×0.4 microns. The tunnel barrier layer 49 has excellent smoothness and uniformity because of the smooth and densely packed seed layer 46, AFM layer 47, and SyAP pinned layer 48 grown on the modified bottom conductor 44b.

The free layer 50 formed on the tunnel barrier layer 49 is preferably made of a moderate spin polarization material as understood by those skilled in the art. A high spin polarization material is defined as a CoFe alloy in which the atomic % of Fe is>20%, a NiFe alloy in which the atomic % of Fe is >40%, or a $[(CoFe)_m B_n]$ alloy with ≧25 atomic % Fe in the CoFe composition. More generally, a high spin polarization material is one which has a magnetization saturation (Ms) value equal to or greater than the aforementioned alloys and a moderate spin polarization material is defined as one which has an Ms value less than the aforementioned alloys.

A moderate spin polarization material helps to minimize the magnetostriction ($\lambda_S$) in the MTJ element. For example, a NiFe layer in which the Fe content is between about 17.5 and 20 atomic % and preferably 18 atomic %, also referred to as permalloy, may be advantageously employed as the free layer 50. In this case, the NiFe layer has a thickness between 30 and 50 Angstroms and preferably 40 Angstroms so that Hc and σHc are minimized. The free layer 50 is magnetically aligned along the MTJ easy axis direction. When the MTJ is elliptically shaped from a top view (not shown), the easy axis of the MTJ element is along its long axis.

The capping layer 51 preferably has a Ru/Ta/Ru configuration as described in Headway application HT04-013 which is herein incorporated by reference. The lower Ru layer has a thickness of about 10 to 30 Angstroms and serves as an inter-diffusion barrier between the NiFe free layer and the intermediate metal layer in the capping layer 51. Moreover, the thickness of the lower metal layer can be adjusted to further reduce magnetostriction in the free layer 50. The intermediate metal layer grown on the lower Ru layer is preferably an α-phase Ta layer with a low resistance and has a thickness from about 20 to 50 Angstroms and preferably 30 Angstroms. Above the intermediate metal layer is an upper metal layer that is preferably Ru with a thickness of about 100 to 250 Angstroms. Ru is preferred as the lower and upper metal layer in the composite capping layer 51 because Ru is inert to oxidation during annealing and is a low resistance conductor. Layers 46–51 form an MTJ stack 53.

After all of the MTJ layers have been deposited in step 30 and then processed through steps 31 and 32, the partially formed MRAM structure 60 may be annealed in a vacuum oven set at about 280° C. by applying a magnetic field of about 6000 to 10000 Oersted for 1 to 5 hours and preferably 10000 Oe for 5 hours. The MRAM structure is completed by a conventional method that involves forming an insulation layer adjacent to the MTJ and forming a top conductor on the insulation layer that contacts the top surface of the capping layer 51.

The inventors have surprisingly found that the process sequence represented by FIG. 5 (which forms the same MTJ stack as used in Table 1 and Table 2) provides the highest MR ratio ever achieved for an MTJ having a 0.3×0.6 micron bit size and a permalloy free layer while maintaining acceptable values for RA, Hc, He, and Hk. Thus, higher readout speeds are achieved for the resulting MRAM array than have been realized by prior art methods. Table 3 indicates that a composite free layer with a [CoFe(10%)/NiFe(18%)] configuration which is about 25 Angstroms thick also yields a high MR value and acceptable RA. Note that the bottom conductor 44b configuration used to generate the results in Table 3 is NiCr50/Ru100/Ta80/SL.

TABLE 3

MTJ results for full film MTJ fabricated by new process flow (FIG. 5)

| S/E (sec.) | ROX (sec.) | Free layer | Bs | RA ohm-μm² | MR % | Hc (Oe) | He (Oe) | Hk (Oe) |
|---|---|---|---|---|---|---|---|---|
| 100 | 175 | NiFe(18%)35 | 0.253 | 4378 | 45.11 | 2.46 | 4.98 | 12.27 |
| 100 | 175 | NiFe(18%)40 | 0.294 | 4412 | 43.70 | 2.21 | 4.20 | 10.88 |
| 100 | 175 | [CoFe(10%)/NiFe(18%)]25 | 0.321 | 4200 | 45.38 | 6.65 | 5.66 | 28.58 |

Since RA increases exponentially with AlOx barrier thickness in the region of best dR/R (MR %), an MTJ with a 0.2×0.4 micron bit size requires a lower RA that should be built with a thinner (8 to 9 Angstrom) Al layer. The inventors have previously demonstrated in Headway application HT04-013 that an MTJ capping layer with a Ru30/Ta30/Ru210 configuration may be successfully used with a 40 Angstrom thick NiFe(18%) free layer and an AlOx tunnel barrier layer made from a 9 to 10 Angstrom thick Al film. By combining the process flow as detailed in FIG. 5 with a moderately polarized free layer such as NiFe(18%) and a Ru30/Ta30/Ru210 capping layer, it is expected that a high performance MTJ with a 0.2×0.4 micron bit size can be produced with an RA<1000 ohm-$\mu m^2$ and dR/R>40%. Therefore, the method of the present invention is believed to be extendable to advanced technologies.

A second embodiment of the present invention is similar to the first embodiment except that the surface treatment (step 28) is performed on an unpatterned bottom conductor and the patterning of the MTJ and bottom conductor are sequentially accomplished following the process flow outlined in FIG. 5. The second embodiment may be selected when an MTJ element is formed on top of a bit line that is comprised of a nickel cladding layer. In this case, the spacing between the bit line and the MTJ free layer is tightly controlled by deposition.

Figure 10:
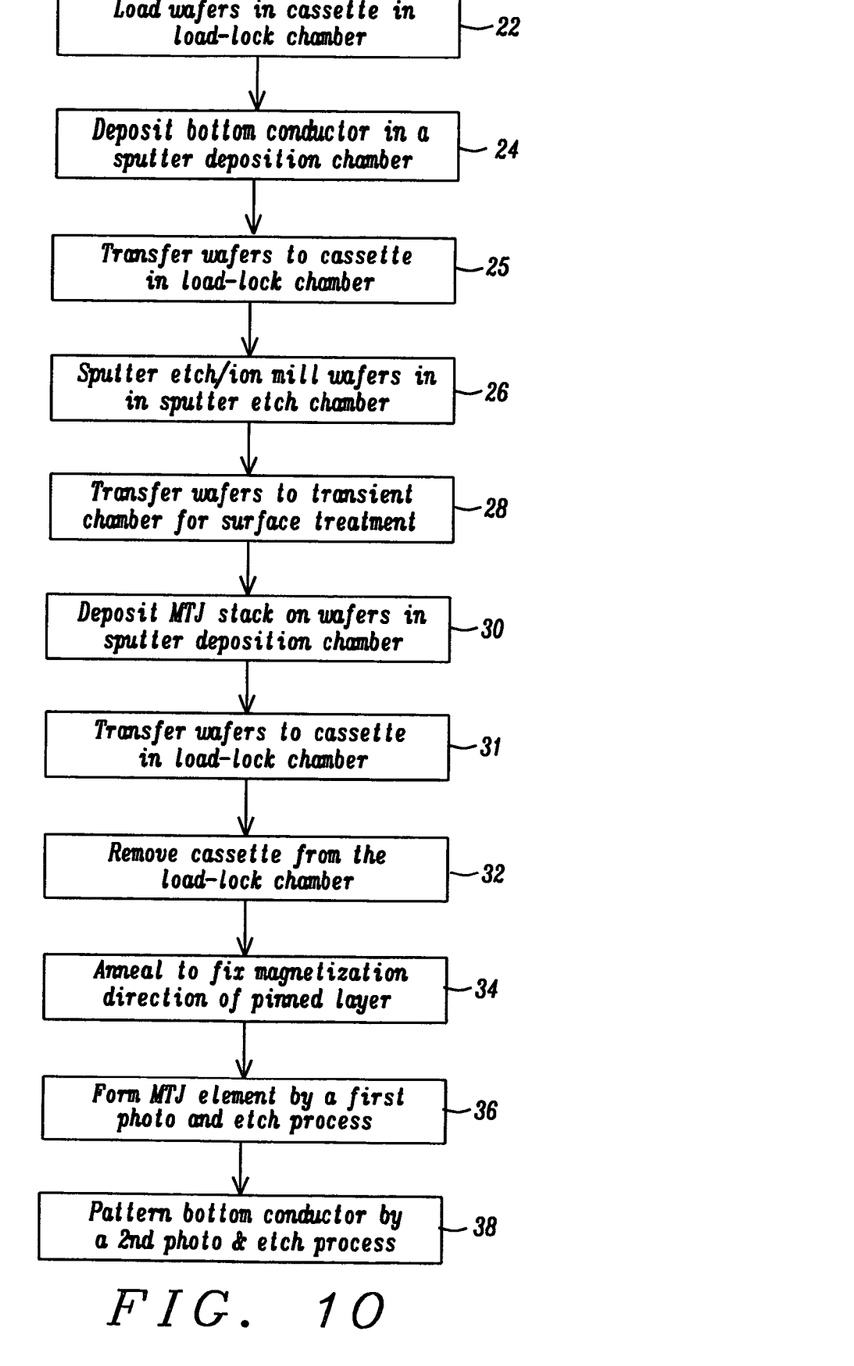
FIG. 10 is a flow diagram showing a second embodiment of forming an MRAM array according to the present invention.

Referring to FIG. 10, a substrate 40 as described previously is loaded into a load-lock chamber of a sputter deposition tool such as an Anelva C-7100 sputter deposition system in step 22. All sputter deposition chambers in the sputter deposition system are maintained at a pressure of about $1 \times 10^{-8}$ to $5 \times 10^{-9}$ torr while the load-lock chamber has a pressure about 1 order of magnitude higher ($5 \times 10^{-7}$ to $5 \times 10^{-8}$ torr) at the end of step 22. Note that there may be a second load-lock chamber in a sputter deposition tool but for the purposes of this discussion, only one load-lock chamber is mentioned in the process flows represented by FIG. 5 and FIG. 10 in a later section. Furthermore, there may be one or more other wafers in the cassette with substrate 40. Hereafter, the exemplary embodiment is described with respect to substrate 40 but it is understood that the one or more other wafers in the cassette are processed likewise.

In step 24, substrate 40 is transferred to a first sputter deposition chamber where a bottom conductor 44 is deposited. The deposition is accomplished with a magnetron sputtering, IBD method, or the like. In one embodiment, a bottom conductor 44 having a seed layer 41, conductor 42, and capping layer 43 as described earlier is formed on the substrate 40.

After step 24 is completed, the substrate 40 is transferred back to a cassette in the load-lock chamber in step 25. Thereafter, steps 26, 28, 30 are performed as described previously in the first embodiment. As a result, an MTJ stack 53 is formed on a modified bottom conductor 44b having a surfactant layer 45 as a topmost layer. Preferably, the sputter deposition chamber used in step 30 is different than the first sputter deposition chamber in step 24 in order to improve throughput.

In step 31, the substrate 40 is moved back to the load-lock chamber. After all the wafers in the cassette have completed the process flow through step 31, the cassette is removed (step 32) from the load-lock chamber and is ready for subsequent processing. In one aspect, steps 22 through 32 are all carried out after a single pump down step in the sputter deposition system.

Next, an anneal step 34 is employed to fix the magnetization direction of the pinned layer 46 and free layer 50 and may be comprised of applying a magnetic field of about 5000 to 10000 Oe at a temperature of 250° C. to 300° C. This step may be performed in an oven with a $N_2$ or inert gas atmosphere.

Figure 11:
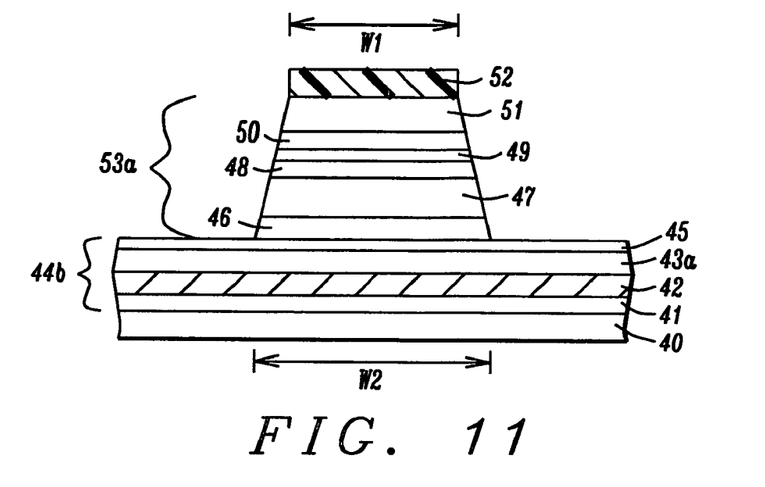
FIG. 11 is a cross-sectional view showing an intermediate step in the formation of an MTJ element according to one aspect of the present invention.
Figure 12:
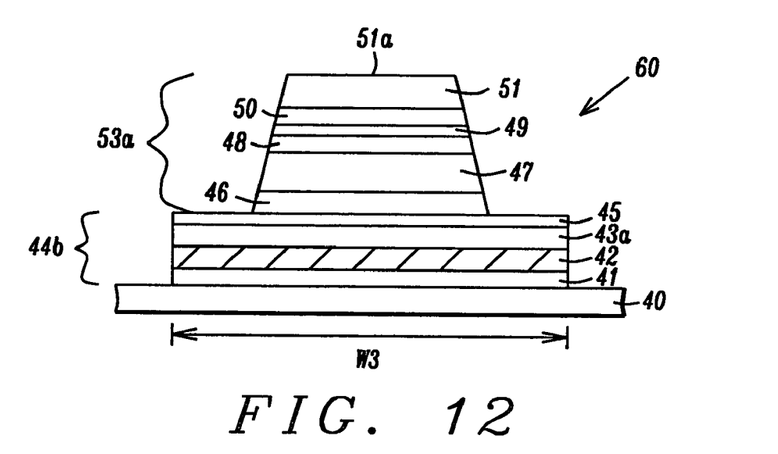
FIG. 12 is a cross-sectional view depicting an intermediate step in the formation of an MRAM array in which an MTJ element and patterned bottom conductor are formed by two sequences of photoresist patterning and etch steps according to one aspect of the present invention.

Referring to FIG. 11, an MTJ element is fabricated by patterning a first photoresist layer 52 having a width $w_1$ on the capping layer 51. Thereafter, a first ion beam etch (IBE) or ion milling process is employed to remove portions of the layers in the MTJ stack that are not covered by the photoresist layer 52. Due to the nature of the IBE process, the seed layer 46 has a width $w_2$ on the surfactant layer 45 that is typically greater than the width w, which is also the width of the capping layer 51 where it contacts the photoresist layer 52. Although the first IBE step is shown stopping on the surfactant layer 45, the etching process may also remove exposed portions of the surfactant layer and a portion of the Ta capping layer from the bottom conductor 44b. Once the first IBE step is completed, the sidewalls of the MTJ element 53a are defined as well as a top surface 51a (FIG. 12). At this point, the first photoresist layer 52 is stripped by a conventional method. The sequence of patterning the first photoresist layer 52, etching the MTJ stack 53 to form the MTJ element 53a, and removing the first photoresist layer is represented by step 36 in FIG. 10.

Referring to FIG. 12, a second photoresist layer (not shown) having a width $w_3$ is then patterned on the MTJ element 53a including top surface 51a and on a portion of the bottom conductor 44b adjacent to the MTJ element. A second IBE step is performed that selectively removes the bottom conductor 44b in regions not covered by the second photoresist layer. Next, the second photoresist layer is stripped by a well known method to yield a bottom conductor 44b having a lengthwise dimension $w_3$ that is preferably greater than $w_2$. The sequence of patterning the second photoresist layer, etching the bottom conductor 44b to form a patterned bottom conductor, and removing the second photoresist layer is represented by step 38 in FIG. 10. At this point the partially formed MRAM structure 60 may be completed by conventional methods that include forming an insulation layer on the substrate 40 and bottom conductor 44b that is about coplanar with the top surface 51a and by forming a top conductor (not shown) on the top surface 51a and on the adjacent insulation layer.

The advantages of the second embodiment are the same as those realized in the first embodiment. An MRAM array having an MTJ bit size of 0.3×0.6 microns is formed wherein the MTJ element has a dR/R greater than 35%, an acceptable RA value of about 3000 to 4000 ohm-$\mu m^2$, a low magnetostriction of less than about 1.0E−6, and low Hc and σHc values. These results represent a higher MTJ performance than heretofore achieved in the prior art. Additional benefits realized by implementing the method of the present invention are that switching of the free layer magnetization is vortex free and can be made with a low switching current.

The present invention also encompasses an MRAM structure that is especially suited for high performance, particularly for MTJ bit sizes of 0.3×0.6 microns and 0.2×0.4 microns. In one embodiment, the MRAM structure is comprised of a patterned bottom conductor 44b formed on a substrate 40 and an MTJ element 53a on a portion of the bottom conductor as described previously and shown in FIG. 12. The bottom conductor 44b may have a seed layer/conductor/capping layer configuration represented by layers 41–43a in which the capping layer 43a has an amorphous character that may be attained by a sputter etch process described earlier (step 26). The smoothness and flatness of the capping layer 43a has been quantified by a high resolution TEM cross-section. A key feature is that a surfactant layer 45 less than 1 atomic layer thick and comprised of oxygen, nitrogen, and hydroxyl groups is formed on the capping layer 43a. Optionally, the surfactant layer 45 may be comprised of oxygen.

In one aspect, the MTJ element has a bottom spin valve configuration in which a seed layer 46, AFM layer 47, pinned layer 48, tunnel barrier 49, free layer 50, and capping layer 51 are sequentially formed on the surfactant layer 45. Since the surfactant layer 45 is flat and smooth, the resulting layers 46–51 in the MTJ element 53a are also flat and smooth which advantageously results in improved MTJ performance that has not been realized previously. For example, when the MTJ element 53a has a 40 Angstrom thick NiFe(18%) free layer 50 and a AlOx tunnel barrier 49a formed by an ROX of a 10 Angstrom thick Al layer, a dR/R as high as 45% and a RA around 4000 ohm-$\mu m^2$ for a 0.3×0.6 bit size can be produced. Moreover, the $\lambda_S$ is less than about $1 \times 10^{-6}$ and low Hc and $\sigma$Hc values are obtained in the MTJ element 53a. An MTJ element 53a having a 0.2×0.4 micron bit size is capable of delivering an RA<1000 ohm-$\mu m^2$ and a dR/R>40% when a 30 to 35 Angstrom thick NiFe(18%) free layer 50 and an AlOx tunnel barrier 49 formed by ROX of a 8 to 9 Angstrom thick Al layer is employed.

It should be understood that the MRAM structure 60 is also comprised of an insulation layer (not shown) which is formed on the bottom conductor 44b and on the substrate 40 and along the sides of the MTJ element 53a. The insulation layer is about coplanar with the top surface 51a of the capping layer 51. The MRAM structure 60 also has a patterned top conductor (not shown) that contacts the top surface 51a of the capping layer 51 as appreciated by those skilled in the art. For a 1M1MTJ, the lengthwise direction of the top conductor (bit line) is aligned parallel to the lengthwise direction of the bottom conductor 44b.

In addition to MRAM applications, an MTJ element with a thinner tunnel barrier layer and a very low resistance x area (RA) value may be employed as a magnetoresistive (MR) sensor in a tunneling magnetoresistive (TMR) magnetic read head. Thus, the present invention also encompasses an embodiment wherein the seed layer and conductor components of the bottom conductor in the previous embodiment are replaced by a bottom shield (S1) for TMR read head applications. A key feature is the capping layer component preferably comprised of amorphous Ta layer 43a and overlying surfactant layer 45 described in the previous embodiment is formed on the bottom shield in the TMR read head and promotes smooth and flat layers in the overlying MTJ element.

Figure 13:
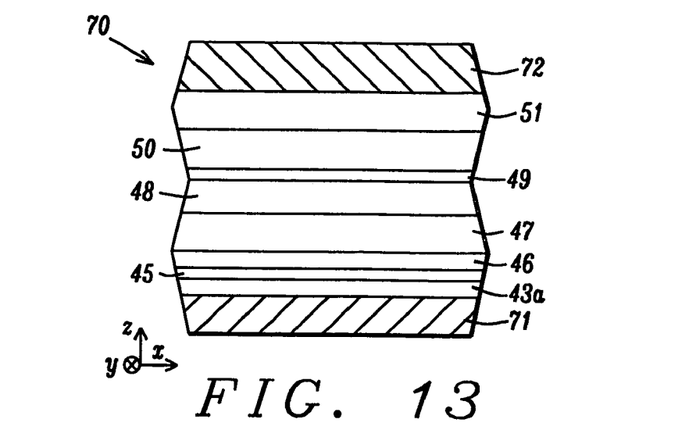
FIG. 13 is a cross-sectional view depicting a portion of a TMR read head formed according to one embodiment of the present invention.

Referring to FIG. 13, a portion of a TMR read head 70 of the present invention is shown from the plane of an air bearing surface (ABS). A capping layer preferably comprised of an amorphous Ta layer 43a and an overlying surfactant layer 45 as described previously is formed on a substrate which is a bottom lead otherwise known as a bottom shield (S1) 71. The bottom shield 71 may be a NiFe layer about 2 microns thick that is formed by a conventional method. It should be understood that the TMR read head is comprised of other components such as a first gap layer below the bottom shield 71 and a second gap layer above the top shield 72 but these layers are not shown in order to simplify the drawing. The MTJ element 53a is comprised of the same layers 46–51 as described in the previous embodiment except that the tunnel barrier 49 is typically thinner in the TMR read head 70 than in the MRAM structure 60 and the free layer 50 may be a CoFe/NiFe composite. In this case, the free layer 50 may have a high spin polarization and a low magnetostriction ($<1 \times 10^{-6}$) while the MTJ element has low Hc and Hk values. A top lead otherwise known as a top shield (S2) 72 is disposed on the capping layer 51 of the MTJ element 53a. The top shield 72 may be a NiFe layer about 2 microns thick.

The amorphous capping layer 43a, surfactant layer 45, and MTJ element 53a in TMR read head 70 are fabricated by a sequence similar to that described with respect to the MRAM structure 60. A method as depicted in FIG. 5 is followed that involves sequentially depositing a capping layer such as Ta and an overlying Ru layer on the patterned bottom shield 71. After loading one or more wafers in a sputter deposition system (step 22), step 26 is performed to remove the Ru layer (not shown) and form an amorphous capping layer 43a. Optionally, Ta and Ru layers may be deposited in the same sputter deposition system in which the process flow in FIG. 5 is performed. The surfactant layer 45 is formed on the amorphous layer 43a in step 28 and then the MTJ stack is deposited in step 30. Following steps 31 and 32, an annealing step is typically carried out to fix the magnetization directions of the pinned layer and free layer. Thereafter, an MTJ element 53a having two sides is formed by a well known photoresist patterning and IBE process. An insulation layer and a hard bias structure (not shown) are formed along each side of the MTJ element 53a as appreciated by those skilled in the art. Thereafter, the photoresist pattern may be removed by a well known lift off method. Then the top shield 72 is disposed on the insulation layer and capping layer 51 by a conventional method. A planar second gap layer (not shown) is typically formed on the top shield 72 to complete the TMR read head 70. A read operation involves moving the TMR read head 70 along the ABS in the z direction over a recording medium which causes an external magnetic field to influence the magnetization direction of the free layer 50.

The TMR read head 70 of the present invention provides the same advantages as mentioned in the first embodiment in that a higher performing MTJ device results from employing an amorphous Ta capping layer and overlying surfactant layer on the bottom shield. The amorphous Ta capping layer/surfactant layer configuration promotes smoother and flatter layers in the MTJ element 53a and thereby improves performance such as higher dR/R and lower Hin.

While this invention has been particularly shown and described with reference to, the preferred embodiment thereof, it will be understood by those skilled in the art that various changes in form and details may be made without departing from the spirit and scope of this invention.

We claim:

1. A method of forming a high performance MTJ element in an MRAM structure, comprising:
    (a) providing a substrate with a bottom conductor formed thereon, said bottom conductor has a configuration wherein a seed layer, conductor, and capping layer are consecutively formed on said substrate;
    (b) loading said substrate in a load-lock chamber of a sputter deposition tool;
    (c) transferring said substrate to a sputter etch chamber where a sputter etch or ion milling process is performed to form an amorphous-like surface on the capping layer;
    (d) performing a surface treatment in a transient vacuum chamber in said sputter deposition tool; said surface treatment comprises self-annealing and forms a surfactant layer on the surface of said capping layer; and (e) forming an MTJ stack of layers on said surfactant layer at a certain pressure in a sputter deposition chamber in said sputter deposition tool.

2. The method of claim 1 wherein the bottom layer in the MTJ stack is a NiCr or NiCrFe seed layer that promotes a flat and smooth AFM layer, pinned layer, and AlOx tunnel barrier layer that are sequentially formed on the seed layer in the MTJ stack.

3. The method of claim 2 wherein the MTJ stack of layers is further comprised of a permalloy free layer on the AlOx tunnel barrier and a capping layer on the free layer.

4. The method of claim 1 wherein said certain pressure is between about $5 \times 10^{-8}$ and $5 \times 10^{-9}$ torr and said transient vacuum chamber is the load-lock chamber or an oxidation chamber that is maintained at a pressure about 1 order of magnitude greater than the certain pressure.

5. The method of claim 3 further comprised of applying a magnetic field to said MTJ stack to fix the pinned layer and free layer magnetization direction.

6. The method of claim 1 wherein said surfactant layer is less than 1 atomic layer thick and the self-annealing results in a relaxation of stress built up during the preceding sputter etch step.

7. The method of claim 1 wherein the said bottom conductor has a Ta seed layer, a Cu conductor, and a composite (Ta/Ru) capping layer having a Ru upper layer and a Ta lower layer, or the bottom conductor has a NiCr seed layer, a Ru conductor, and a Ta/Ru composite capping layer wherein the sputter etch or ion milling step removes the Ru upper layer of the capping layer and an upper portion of the Ta lower layer.

8. The method of claim 4 wherein the transient vacuum chamber is the load-lock chamber and the surface treatment step comprises a self annealing and forms a surfactant layer comprised of oxygen, nitrogen, and hydroxyl groups.

9. The method of claim 4 wherein the transient vacuum chamber is an oxidation chamber and the surface treatment step comprises a residence time of at least 30 seconds at an ambient temperature and forms a surfactant layer comprised of oxygen.

10. The method of claim 3 further comprised of patterning the MTJ stack of layers to form an MTJ element having sidewalls and a top surface, forming an insulation layer on the substrate and bottom conductor and along the sidewalls of the MTJ element that is about coplanar with said top surface, and then forming a top conductor on the insulation layer that contacts said top surface of the MTJ element.

11. A method of forming an MRAM structure comprised of a high performance MTJ element on a substrate, comprising:
(a) sputter depositing a bottom conductor comprised of a lower seed layer, a middle conductor, and an upper capping layer on said substrate in a sputter deposition tool having multiple chambers;
(b) sputter etching said substrate with a sputter etch or ion milling process to form an amorphous-like surface on the capping layer in said bottom conductor;
(c) performing a surface treatment in a transient vacuum chamber in said sputter deposition tool; said surface treatment comprises self-annealing and forms a surfactant layer on the surface of said capping layer;
(d) forming an MTJ stack of layers on said surfactant layer at a certain pressure in a sputter deposition chamber in said sputter deposition tool;
(e) patterning the MTJ stack of layers to form an MTJ element having a top surface, sidewalls, and a first width; and
(f) patterning the bottom conductor wherein the bottom conductor has a lengthwise dimension that is greater than said first width.

12. The method of claim 11 wherein steps (a)–(d) are performed after a single pump down step in the sputter deposition tool, said sputter deposition chamber has a first pressure from about $5 \times 10^{-8}$ to $5 \times 10^{-9}$ torr and said transient vacuum chamber is kept at a pressure about an order of magnitude higher than the first pressure.

13. The method of claim 11 further comprised of applying a magnetic field to the MTJ stack of layers prior to patterning the MTJ stack of layers to form an MTJ element in order to fix the pinned layer and free layer magnetization direction.

14. The method of claim 11 wherein the MTJ stack is comprised of the following layers which are sequentially formed on the bottom conductor: a NiCr seed layer;
a MnPt AFM pinning layer; a SyAP pinned layer having a CoFe/Ru/CoFe configuration; an AlOx tunnel barrier; a NiFe(18%) free layer; and a Ru/Ta/Ru capping layer.

15. The method of claim 11 further comprised of loading the substrate in a load-lock chamber prior to step (a) and transferring the substrate to a load-lock chamber between steps (a) and (b).

16. The method of claim 11 wherein said surfactant layer is less than 1 atomic layer thick and self-annealing results in a relaxation of stress built up during the preceding sputter etch step.

17. The method of claim 11 wherein said bottom conductor has a Ta seed layer, a Cu conductor, and a composite (Ta/Ru) capping layer having a Ru upper layer and a Ta lower layer, or the bottom conductor has a NiCr seed layer, a Ru conductor, and a composite (Ta/Ru) capping layer wherein the sputter etch or ion milling step removes the Ru upper layer of the capping layer and an upper portion of the Ta lower layer.

18. The method of claim 11 wherein the transient vacuum chamber is a load-lock chamber and the surface treatment step comprises a self annealing and forms a surfactant layer comprised of oxygen, nitrogen, and hydroxyl groups.

19. The method of claim 11 wherein the transient vacuum chamber is an oxidation chamber and the surface treatment step comprises a residence time of at least 30 seconds at an ambient temperature and forms a surfactant layer comprised of primarily of oxygen.

20. The method of claim 11 further comprised of forming an insulation layer on the substrate and bottom conductor and along the sidewalls of the MTJ element that is about coplanar with said top surface, and then forming a top conductor on the insulation layer that contacts said top surface of the MTJ element.

* * * * *